United States Patent
Garwood et al.

(10) Patent No.: US 12,372,595 B2
(45) Date of Patent: Jul. 29, 2025

(54) MULTI-ECHO RADIO FREQUENCY (RF) BASED SPATIAL ENCODING IN MAGNETIC RESONANCE IMAGING USING FREQUENCY-MODULATED RF PULSES

(71) Applicant: Regents of the University of Minnesota, Minneapolis, MN (US)

(72) Inventors: Michael Garwood, Minneapolis, MN (US); Efraín Torres, Minneapolis, MN (US); Taylor Froelich, Minneapolis, MN (US)

(73) Assignee: REGENTS OF THE UNIVERSITY OF MINNESOTA, Minneapolis, MN (US)

( * ) Notice: Subject to any disclaimer, the term of this patent is extended or adjusted under 35 U.S.C. 154(b) by 113 days.

(21) Appl. No.: 18/137,912

(22) Filed: Apr. 21, 2023

(65) Prior Publication Data

US 2023/0341486 A1 Oct. 26, 2023

Related U.S. Application Data

(60) Provisional application No. 63/369,123, filed on Jul. 22, 2022, provisional application No. 63/333,452, filed on Apr. 21, 2022.

(51) Int. Cl.
 - *G01V 3/00* (2006.01)
 - *G01R 33/36* (2006.01)
 - *G01R 33/56* (2006.01)
 - *G06T 11/00* (2006.01)

(52) U.S. Cl.
CPC ..... *G01R 33/3607* (2013.01); *G01R 33/5608* (2013.01); *G06T 11/005* (2013.01); *G06T 11/006* (2013.01); *G06T 2211/424* (2013.01)

(58) Field of Classification Search
CPC ............ G01R 33/3607; G01R 33/5608; G06T 11/005; G06T 11/006; G06T 2211/424
USPC ......................................................... 324/309
See application file for complete search history.

(56) References Cited

U.S. PATENT DOCUMENTS

| | | | |
|---|---|---|---|
| 9,995,808 B2 | 6/2018 | Grissom et al. | |
| 10,830,851 B2 | 11/2020 | Wald et al. | |
| 2004/0140803 A1* | 7/2004 | Deimling | G01R 33/56341 324/309 |
| 2014/0350439 A1* | 11/2014 | Zur | G01R 33/385 601/3 |

(Continued)

OTHER PUBLICATIONS

Barmet C., Zanche, N. D., & Pruessmann, K. P. (2008). Spatiotemporal magnetic field monitoring for MR. Magnetic Resonance in Medicine: An Official Journal of the International Society for Magnetic Resonance in Medicine, 60(1), 187-197.

(Continued)

*Primary Examiner* — Walter L Lindsay, Jr.
*Assistant Examiner* — Frederick Wenderoth
(74) *Attorney, Agent, or Firm* — QUARLES & BRADY LLP

(57) ABSTRACT

Multi-echo radio frequency ("RF") gradient based magnetic resonance imaging ("MRI") is described. A gradient is established in the B1 RF field to enable B1-encoded pulse sequences, such as B1-encoded spin-echo pulse sequences. As a non-limiting example, the B1-field gradient can be established using a multi-echo frequency-modulated Rabi encoded echoes ("ME-FREE") technique.

25 Claims, 6 Drawing Sheets

(56) References Cited

U.S. PATENT DOCUMENTS

| | | | |
|---|---|---|---|
| 2015/0253403 | A1 | 9/2015 | Grissom et al. |
| 2016/0061917 | A1 | 3/2016 | Chase et al. |
| 2019/0369193 | A1 | 12/2019 | Kobayashi et al. |
| 2024/0219496 | A1 | 7/2024 | Garwood et al. |

OTHER PUBLICATIONS

Canet, D. (1997). Radiofrequency field gradient experiments. Progress in Nuclear Magnetic Resonance Spectroscopy, 30(1-2), 101-135.

Cao, Z., Chekmenev, E. Y., & Grissom, W. A. (2014). Frequency encoding by Bloch-Siegert shift. Proc. 22nd Annu. Meet. Int. Soc. Magn. Res. Med, 4220.

Casanova, F., et al. Echo-planar rotating-frame imaging. J Magn Reson 2003; 162(2):396-401.

Cooley, Clarissa Zimmerman. Portable low-cost magnetic resonance imaging. Diss. Massachusetts Institute of Technology, 2014; 153 pages.

Cooley, Clarissa Zimmerman, et al. "Two-dimensional imaging in a lightweight portable MRI scanner without gradient coils." Magnetic resonance in medicine 73.2 (2015): 872-883.

Cunningham, Ch, et al. Saturated double-angle method for rapid B+1 mapping. Magn Reson Med. 2006;55:1326-1333. doi:10.1002/mrm.20896.

Deng, Q, et al. B1 transmit phase gradient coil for single-axis TRASE RF encoding. Magn Reson Imaging. 2013;31:891-899. doi:10.1016/j.mri.2013.03.017.

Froelich, T. et al. "Fast spin-echo approach for accelerated B1 gradient-based MRI." Magnetic resonance in medicine 89.6 (2023): 2204-2216.

Froelich, T., et al. MRI exploiting frequency-modulated pulses and their nonlinear phase. J Magn Reson 2020;318:106779; 10 pages.

Garwood, M, DelaBarre L. The return of the frequency sweep: Designing adiabatic pulses for contemporary Nmr. J Magn Reson 2001;153:155-177.

Garwood, M., et al. A Modified Rotating Frame Experiment Based on a Fourier-Series Window Function—Application to Invivo Spatially Localized Nmr-Spectroscopy. J Magn Reson 1985;65(2):239-251.

Garwood, M., et al. (2018). RF pulse methods for use with surface coils: Frequency-modulated pulses and parallel transmission. Journal of Magnetic Resonance, 291, 84-93.

Gutierrez A, Mullen M, Xiao D, Jang A, Froelich T, Garwood M, Haupt J. Reducing the Complexity of Model-Based MRI Reconstructions via SparsiMcation. IEEE Transactions on Medical Imaging 2021;40:2477-2486.

Hasselwander, et al., Bloch-Siegert Phase-Encoded MRI with a Single RF Coil and Frequency-Swept Pulses, Proceedings of the International Society for Magnetic Resonance in Medicine, ISMRM, 25th Annual Meeting and Exhibition, Honolulu, HI, USA, Apr. 22-Apr. 27, 2017, No. 5047, Apr. 7, 2017, XP040692615, retrieved from the Internet URL: https://cds.ismrm.org/protected/17MProceedings/PDFfiles/5047.html, retrieved Jan. 27, 2025 [3 pgs].

Hedges, L. Kyle, and D. I. Hoult. "The techniques of rotating frame selective excitation and some experimental results." Journal of Magnetic Resonance (1969) 79.3 (1988): 391-403.

Hoult, DI. Rotating frame zeugmatography. Journal of Magnetic Resonance (1969) 1979;33:183-197.

Hoult, DI. NMR imaging—rotating frame selective pulses. J Magn Reson. 1980;38:369-374. doi:10.1016/0022-2364 (80)90289-9.

Hwang, T-L, van Zijl PCM, Garwood M. Broadband adiabatic refocusing without phase distortion. J Magn Reson. 1997; 124:250-4.

Jankiewicz, M., et al. Improved encoding pulses for Bloch-Siegert B1+ mapping. J Magn Reson, 226:79-87, 2013.

Juchem, C, Theilenberg et al. Dynamic multicoil technique (Dynamite) MRI on human brain. Magnetic Resonance in Medicine. 2020;84(6):2953-63. doi: https://doi.org/10.1002/mrm.28323.

Kaczynski, J, et al. Selective excitation in the rotating frame with hard pulses. J Magn Reson. 1992; 100:453-468. doi:10.1016/0022-2364(92)90053-A.

Kartausch, R, Driessle T, Kampf T, et al. Spatial phase encoding exploiting the Bloch-Siegert shift effect. MAGMA. 2014;27:363-371. doi:10.1007/s10334-013-0417-0.

Katscher U, Lisinski J, Börnert P. RF encoding using a multielement parallel transmit system. Magnet Reson Med 2010;63:1463-1470.

Khalighi, B., et al. Adiabatic RF pulse design for Bloch-Siegert B1+ mapping. Magn Reson Med, 70(3):829-835, 2013.

Kobayashi, N., Parkinson B, Idiyatullin D, Adriany G, Theilenberg S, Juchem C, Garwood M. Development and validation of 3D MP-SSFP to enable MRI in inhomogeneous magnetic Melds. Magnetic Resonance in Medicine 2021;85:831-844.

Koch, Kevin M., et al. "A multispectral three-dimensional acquisition technique for imaging near metal implants." Magnetic Resonance in Medicine: An Official Journal of the International Society for Magnetic Resonance in Medicine 61.2 (2009): 381-390.

Macovski, A, Conolly S. Novel approaches to low-cost MRI. Magn Reson Med 1993;30(2):221-230.

Maffei, P, Mutzenhardt P, Retournard A, Diter B, Raulet R, Brondeau J, Canet D. Nmr Microscopy by Radiofrequency Field Gradients. J Magn Reson Ser A 1994; 107(1): 40-49.

Marques, JP, Kober T, Krueger G, van der Zwaag W, Van de Moortele PF, Gruetter R. MP2RAGE, a self bias-field corrected sequence for improved segmentation and T1-mapping at high field. Neuroimage. 2010;49(2): 1271-81. Epub 2009/10/13. doi: 10.1016/j.neuroimage.2009.10.002. PubMed PMID: 19819338.

Martin, JB, . Selective excitation localized by the Bloch-Siegert shift and a B 1 + gradient. Magn Reson Med. 2022;88:1081-1097. doi:10.1002/mrm.29271.

Meriles, CA, Sakellariou D, Pines A. Broadband phase modulation by adiabatic pulses. JMagn Reson. 2003;164:177-181. doi:10.1016/s1090-7807(03)00157-5.

Mullen, M, et al. Two-dimensional frequency-swept pulse with resilience to both B1 and B0 inhomogeneity. Journal of Magnetic Resonance. 2019;299:93-100. doi: https://doi.org/10.1016/j.jmr.2018.12.017.

Mullen, M, et al. Corrigendum to "Two-dimensional frequency-swept pulse with resilience to both B1 and B0 inhomogeneity" [J. Magn. Reson. 299 (2019) 93-100]. Journal of Magnetic Resonance. 2019;305:93. doi: https://doi.org/10.1016/j.jmr.2019.06.007.

Mullen, M., et al. Contemporary approaches to high-field magnetic resonance imaging with large field inhomogeneity. Prog Nucl Magn Reson Spectrosc. 2020; 120-121:95-108. Epub Nov. 18, 2020. doi: 10.1016/j.pnmrs.2020.07.003. PubMed PMID: 33198970; PMCID: PMC7672259.

Mullen, M., & Garwood, M. (2021). Dual polarity encoded MRI using high bandwidth radiofrequency pulses for robust imaging with large field inhomogeneity. Magnetic resonance in medicine, 86(3), 1271-1283.

Patz, S., S. T. S. Wong, and M. S. Roos. "Missing pulse steady-state free precession." Magnetic resonance in medicine 10.2 (1989): 194-209.

Sharp JC King SB. MRI Using Radiofrequency Magnetic Field Phase Gradients. Magnet Reson Med 2010;63 (1):151-161.

Silver, MS, Joseph RI, Hoult DI. Highly selective TT2 and TT pulse generation. Journal of Magnetic Resonance (1969) 1984;59(2):347-351.

Tannus, A., Garwood M. Adiabatic pulses. NMR Biomed. 1997; 10(8): 423-34. Epub 1998/05/23. PubMed PMID: 9542739.

Torres, Efraín, et al. "B1-gradient-based MRI using frequency-modulated Rabi-encoded echoes." Magnetic resonance in medicine 87.2 (2022): 674-685.

Trakic, Adnan, et al. "Model for B1 imaging in MRI using the rotating RF field." Computational and Mathematical Methods in Medicine 2014.1 (2014): 461647; 11 pages.

Umesh, Rudrapatna, S., et al. "Combined imaging and shimming with the dynamic multi-coil technique." Magnetic Resonance in Medicine 81.2 (2019): 1424-1433.

Wald, LL, et al. Low-cost and portable MRI. J Magn Reson Imaging 2020;52(3):686-696.

(56) References Cited

OTHER PUBLICATIONS

Wang P, Froelich T, Torres E, et al. Correcting image distortions from a nonlinear B1-gradient in frequency-modulated Rabi-encoded echoes. Magn Reson Med. 2022; 1-9. doi: 10.1002/mrm.29549.

Zhang, Z., Lustig, M., & Frydman, L. (2018). Phase-encoded xSPEN: a novel high-resolution volumetric alternative to Rare Mri. Magnetic Resonance in Medicine, 80(4), 1492-1506.

PCT International Search Report and Written Opinion, PCT/US2022/027319, Aug. 16, 2022, 8 pages.

European Patent Office, Extended European Search Report for corresponding European Patent Application No. 22796926.8, dated Jan. 23, 2025, 14 pages.

\* cited by examiner

MULTI-ECHO RADIO FREQUENCY (RF) BASED SPATIAL ENCODING IN MAGNETIC RESONANCE IMAGING USING FREQUENCY-MODULATED RF PULSES

STATEMENT OF FEDERALLY SPONSORED RESEARCH

This invention was made with government support under EB027061 and EB025153 awarded by the National Institutes of Health. The government has certain rights in the invention.

BACKGROUND

Despite the tremendous advantages that magnetic resonance imaging ("MRI") provides, most of the world's population lacks access due to the high costs to obtain, transport, and maintain the associated infrastructure of a conventional MRI scanner Recently, several different groups have focused on addressing the inequities in accessibility and underutilized that MRI faces by focusing on the development of new technology to reduce the overall cost and complexity of conventional imaging systems. One proposed method seeks to replace traditional $B_0$ gradients in favor of new radiofrequency ("RF") based techniques to perform similar spatial encoding. The elimination of conventional $B_0$ gradients would provide several important advantages while also decreasing the overall size and cost of a conventional MRI scanner. Further improvements to the portability could be realized by coupling new these emerging RF-based imaging ("RFI") techniques with MRI scanners that operate in the mid to low field strengths (e.g., $B_0 \leq 1.5$ T). At these low fields, RFI techniques become significantly more viable as the specific absorption rate ("SAR") constraints are reduced and parallel transmission ("pTx") based techniques can more accurately shape the $B_1$ encoding fields.

One recently developed RFI technique called FREE (Frequency-modulated Rabi Encoded Echoes) improves upon previously developed RFI methods by providing robustness to resonance offset, which is common in lower field inhomogeneous systems. FREE achieves this through a pair of frequency-modulated ("FM") adiabatic full passage ("AFP") RF pulses in a double spin echo configuration. By utilizing AFP pulses in the presence of a spatially-varying RF field, $B_1(r)$, FREE has shown that spatial information can be encoded within the bandwidth of the pulse that is essentially immune to resonance offsets. However, to encode spatial information the original FREE technique utilized a multi-shot approach, in which one point of k-space was acquired at a time. This multi-shot approach provided a good proof of concept to the idea, but its clinical viability is lacking in that acquisition times are long, and acceleration is not easily achievable.

SUMMARY OF THE DISCLOSURE

The present disclosure addresses the aforementioned drawbacks by providing a method for magnetic resonance imaging ("MRI"). The method includes acquiring magnetic resonance data from a subject using an MRI system by generating a pulse sequence with the MRI system. The pulse sequence includes a radio frequency ("RF") excitation pulse and a train of frequency-modulated RF pulses. The train of frequency-modulated RF pulses includes at least: a first frequency-modulated RF pulse having a first time-bandwidth product, where the first frequency-modulated RF pulse is generated after the RF excitation pulse; a second frequency-modulated RF pulse having a second time-bandwidth product, where the second frequency-modulated RF pulse is generated after the first frequency-modulated RF pulse; and a plurality of frequency-modulated RF pulses generated after the second frequency-modulated RF pulse and each having a third time-bandwidth product. In some implementations, each subsequent one of the plurality of frequency-modulated RF pulses has an alternating polarity. In other implementations, each subsequent one of the plurality of frequency-modulated RF pulses has the same polarity. Magnetic resonance data are acquired with the MRI system by sampling magnetic resonance signals formed in multiple echoes in response to the RF excitation pulse, where a phase whose value is dependent on the first time-bandwidth product and the second time-bandwidth product and the plurality of frequency-modulated RF pulses is imparted to magnetic resonance signals formed in response to the RF excitation pulse. A difference between the first time-bandwidth product and the second time-bandwidth product is changed at least one of within the pulse sequence or in repetitions of the pulse sequence in order to phase encode the magnetic resonance data. Additionally, phase encoding can be provided by a sum (alternating polarity RF pulses) or difference (equal polarity RF pulses) of phases imparted by the train of RF pulses. An image is then reconstructed from the acquired magnetic resonance data.

It is another aspect of the present disclosure to provide a method for MRI, in which magnetic resonance data are acquired from a subject using an MRI system to generate a pulse sequence that phase encodes the magnetic resonance data by imparting a phase to magnetic resonance signals by applying a series of frequency-modulated RF pulses to the subject to form multiple echoes in each repetition of the pulse sequence. At least one of the plurality of frequency-modulated RF pulses has a variable time-bandwidth product relative to other ones of the plurality of frequency-modulated RF pulses, thereby defining an R-difference value between at least two of the frequency-modulated RF pulses, which causes the phase to be imparted to the magnetic resonance signals. An image is then reconstructed from the acquired magnetic resonance data.

The foregoing and other aspects and advantages of the present disclosure will appear from the following description. In the description, reference is made to the accompanying drawings that form a part hereof, and in which there is shown by way of illustration one or more embodiments. These embodiments do not necessarily represent the full scope of the invention, however, and reference is therefore made to the claims and herein for interpreting the scope of the invention.

DETAILED DESCRIPTION

Figure 1:
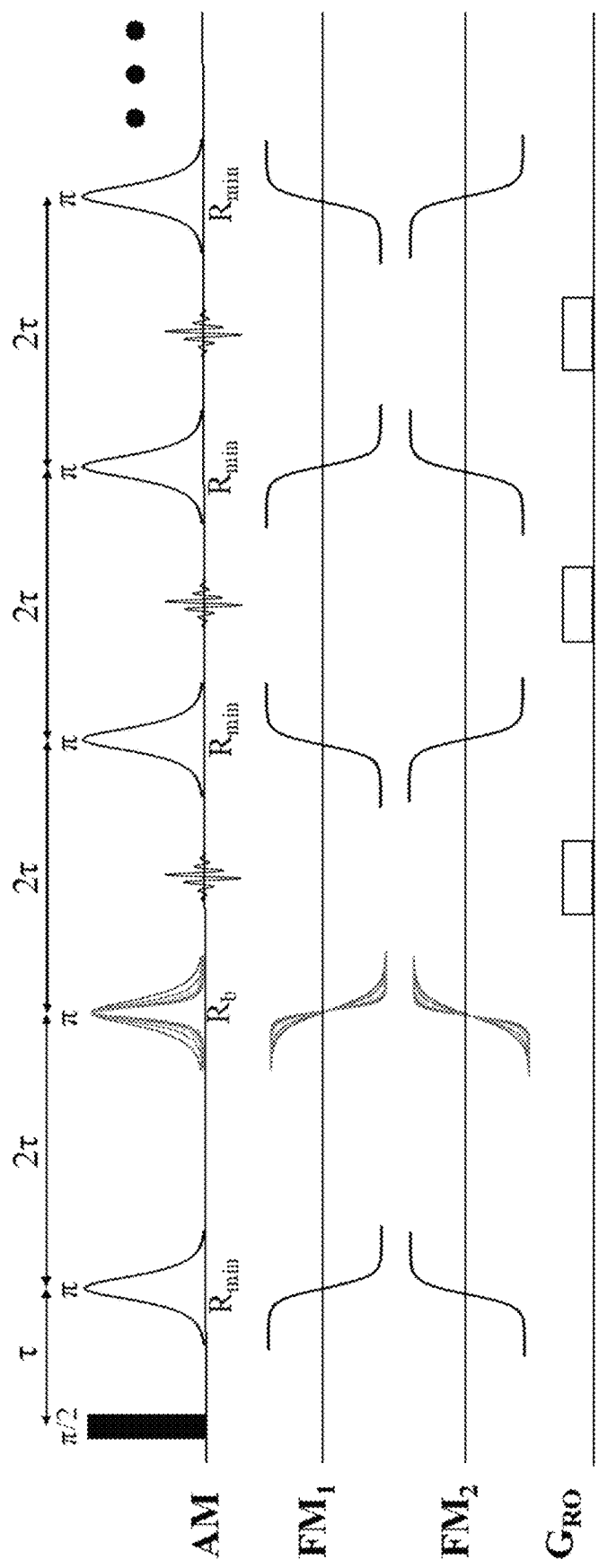
FIG. 1 illustrates an example multi-echo FREE pulse sequence in accordance with some embodiments described in the present disclosure. The sequence uses a standard $B_0$ gradient along the frequency-encoding dimension, and RF-based spatial encoding along the other spatial dimensions. By having a spatially varying $B_1^+$ along an orthogonal dimension, a 2D image can be acquired. The phase difference created between the first pair of pulses ($R_b$ and $R_{min}$) controls the initial step direction in k-space with the additional pulses adding a constant phase to incrementally step further along k-space.

Described here systems and methods for multi-echo radio frequency ("RF") gradient-based magnetic resonance imaging ("MRI"). In particular, a gradient is established in the B1 RF field to enable B1-encoded pulse sequences, such as B1-encoded spin-echo pulse sequences. As a non-limiting example, the B1-field gradient can be established using a multi-echo frequency-modulated Rabi encoded echoes ("ME-FREE") technique. In some embodiments, a model-based image reconstruction framework can be implemented to reconstruct images from data acquired or otherwise encoded using the ME-FREE techniques described in the present disclosure.

Advantageously, the systems and methods described in the present disclosure address the problems of the high-cost and low-accessibility of conventional MRI. In general, the systems and methods described in the present disclosure allow for spatial encoding, such as phase-encoding, based on B1-field gradients rather than using gradient coils to establish a magnetic field gradient in the main magnetic field, $B_0$, of the MRI scanner. Advantageously, the ME-FREE technique described in the present disclosure can be adapted for used with any suitable multi-echo pulse sequence, including those based on multiple spin echoes, multiple gradient echoes, or other such principles.

In the ME-FREE techniques described in the present disclosure, multiple echoes are collected during a single shot. This sequence leverages the acceleration of conventional fast spin echo ("FSE") approaches without needing magnetic field gradients for spatial encoding. In some implementations, one conventional $B_0$ frequency-encoding gradient may be implemented. Multiple echoes can be acquired during a single shot and produce comparable images to conventional FREE in a fraction of the time.

With the ME-FREE techniques described in the present disclosure, MRI systems can be more widely distributed. Advantageously, the systems and methods can be implemented with low-field (e.g., 0.2 T to 1.5 T) Mill systems, and/or portable MRI systems. In addition, the ME-FREE techniques described in the present disclosure can facilitate silent MRI, since the ME-FREE techniques allow for imaging without gradient coils, which are the components that create significant noise in conventional MRI. Noiseless MRI is advantageous for pediatric imaging and the general population.

The ME-FREE systems and methods described in the present disclosure overcome the challenges of previous RF imaging ("RFI") techniques (e.g., rotating frame zeugmatography, transmit array spatial encoding ("TRASE"), Bloch-Siegert shift encoding, and so on) by using a frequency-modulated ("FM") RFI method that accomplishes spatial encoding using adiabatic full-passage ("AFP") pulses (e.g., hyperbolic secant ("HS") pulses, chirp pulses), in multi-echo spin echo or other multi-echo pulse sequences. As an example, 180-degree frequency swept RF pulses can be used, which advantageously don't require extra power (i.e., decreased power deposition) and are more efficient. In ME-FREE, spatial information is encoded in the phase of the magnetization that results when an echo train is formed by applying a train of AFPs, or other frequency-modulated RF pulses, that are transmitted with a spatially varying RF field amplitude, $B_1(r)$.

In conventional FREE, a multi-shot pulse sequence (e.g., a multi-shot double spin echo ("DSE") sequence) is used, in which the time-bandwidth product (R) of two AFP pulses are modulated in the presence of a spatially varying RF transmit field, $B_1^+$, to provide spatial encoding. In this configuration, the initial spatially varying phase created by the first pulse is partially refocused by the application of an addition pulse. By modulating the differences in the time-bandwidth products of each respective pulse, an approximately linear spatially varying residual phase can be created in the acquired echo. Acquiring an array of echoes in this manner provides spatial encoding analogous to conventional phase encoding where one k-space point, along the FREE dimension, is acquired per shot. In principle, any AFP pulse can be used to perform FREE. As a non-limiting example, the AFP pulses can be HSn pulses, which are advantageous for their performance across large bandwidths and general widespread clinical use.

Traditionally, HSn pulses are described by their amplitude and frequency modulation functions (AM and FM, respectively). The AM and FM functions, in angular velocity, for any HSn pulse can be written as, $$\omega_1(\tau, r) = \omega_1^{max}(r)\text{sech}(\beta\tau^n); \tag{1}$$

$$\omega_{RF}(\tau) = \omega_c + A\int_{-1}^{1}\text{sech}^2(\beta\tau^n)d\tau; \tag{2}$$

where $\omega_1^{max}$ is the peak spatially varying Rabi frequency in rad/s; $\tau$ is the normalized pulse duration given by $\tau=2t/T_p-1$, for $t\in$ in $[0, T_p]$; $\omega_c$ is the center frequency of the frequency sweep; A is the frequency-sweep cutoff in rad/s; and $\beta$ is a unitless truncation factor set such that sech($\beta$)=0.01, where n is the order of the HS pulse which controls the flatness of the AM function.

From the rotating frame of reference, the bulk magnetization vector evolves about an effective field, $\vec{B}_{eff}$, created by the time evolution of the applied AM and FM functions for a given pulse. Traditionally, the frequency at which $\vec{B}_{eff}$ evolves at is constant in space, only varying in time. By introducing a spatially $B_1^+$, the equation becomes, $$\omega_{eff}(t, r)=\omega_1(t, r)\hat{x}'+(\omega_{RF}(t)-\omega_c)\hat{z}' \quad (3).$$

Thus, at the end of an applied pulse, the spatially dependent phase accrued is given by, $$\psi(r) = \pm \frac{T_p}{2} \int_{-1}^{1} \|\omega_{eff}(\tau, r)\| d\tau, \quad (4)$$

where the sign is determined by the direction of applied frequency sweep. In practice, $\omega_{eff}$ is evaluated numerically, especially for higher order HS pulses. For the an example DSE-FREE sequence, the net phase can be expressed as the difference of the resulting phase produced by each AFP pulse, $$\Delta\psi(r) = \frac{T_{p,B}}{2} \int_{-1}^{1} \|\omega_{eff,B}(\tau, r)\| d\tau - \frac{T_{p,A}}{2} \int_{-1}^{1} \|\omega_{eff,A}(\tau, r)\| d\tau. \quad (5)$$

This framework can be extended to the multi-echo FREE sequences described in the present disclosure.

An accelerated multi-echo version of the FREE technique is provided by the systems and methods described in the present disclosure. To achieve this acceleration, the proposed sequence modifies the multi-shot FREE with the addition of a train of AFP pulses (which may have alternating or equal polarities) to augment the phase of later echoes approximately linearly, thereby acquiring new points in k-space.

There are several different pulse modulation schemes that can be employed to encode spatial information in FREE-type sequences. The different modulation schemes can determine how and when different parts of k-space are sampled during an imaging experiment, and are often chosen such that the center of k-space is acquired during the middle of an acquisition.

To minimize the extent in which large time-bandwidth product valued (i.e., R-valued) pulses are used, the encoding scheme utilized by the ME-FREE techniques described in the present disclosure can employ a multi-shot, inwards-outwards sampling pattern to acquire both halves of k-space, as illustrated in FIG. 1. In this sequence, the center of k-space is acquired early on during an imaging experiment with further k-space points being collected during the echo train. In other implementations, a sampling pattern other than the inwards-outwards sampling pattern illustrated in FIG. 1 can also be used.

As with a DSE FREE sequence, the center of k-space corresponds to when the initial pair of AFP pulses have equal time-bandwidth product values and, therefore, refocuses any residual phase present in the subsequently formed echo. Building from this idea, the application of additional AFP pulses in a train can be used to further modulate the phase of subsequent echoes.

To control the amount of phase added to each echo and still maintain relatively small R-valued (i.e., time-bandwidth product-valued) pulses, the RF pulse train is composed of AFPs of value $R_{min}$, but with alternating signs of the FM functions. By changing the direction of the frequency sweep throughout the train any additional pulses beyond the initial pair can add a fixed amount of phase that is proportional to Echo·$\psi$(r) of the $R_{min}$th pulses. As the first pair of pulses continue to modulate, the initial phase will change by $\Delta R$, but the jumps produced by the train of AFPs will remain constant and thus the gaps in k-space will begin to fill. To prevent double sampling, $R_{max}$, is selected not to exceed 2·$R_{min}$, and $\Delta R$ is set such that $\Delta R=R_{min}$/Shots. These expressions can be combined to result in $R_{max}=2·R_{min}-\Delta R$.

To illustrate the unique trajectory of the ME-FREE sequence and allow for the calculation of conventional imaging parameters, the previously described equations for FREE can be modified to account for the additional phase imparted by the pulses during the echo train. Starting with Eqn. (5), the phase difference between two AFPs can be extended to describe the sequence in FIG. 1 with the net phase being a function of the modulated pulse, b, and the echo number, $$\Delta\psi_{MultiEcho}(b, \text{Echo}, r) = \\ \left(\frac{T_{p,b}}{2} \int_{-1}^{1} \|\omega_{eff,b}(\tau, r)\| d\tau - \frac{T_{p,min}}{2} \int_{-1}^{1} \|\omega_{eff,min}(\tau, r)\| d\tau\right) + \\ (\text{Echo} - 1)\left(\frac{T_{p,min}}{2} \int_{-1}^{1} \|\omega_{eff,min}(\tau, r)\| d\tau\right). \quad (6)$$

In this equation, $T_{p,b}$ corresponds to the pulse duration of the modulating pulse, $T_{p,min}$ and $\omega_{eff,min}$ refer to the minimum pulse duration and corresponding phase produced by said pulse respectively, and Echo corresponds to the number of acquired echoes with Echo$\in[1, N]$. Any number of acquired echoes greater than zero are valid.

This equation describes the phase variation between corresponding shots and echoes as a function of space and, thus, is analogous to the conventional phase encoding term produced by the dot product of a given k-space trajectory with space. Taking the partial derivative with respect to space will then give an equation that describes the k-space behavior of the ME-FREE sequence. Eqn. (6) and its subsequent derivatives form a framework for analyzing the encoding schemes produced by ME-FREE and any other FREE sequence that relies on the phase difference of AFPs.

Figure 2:
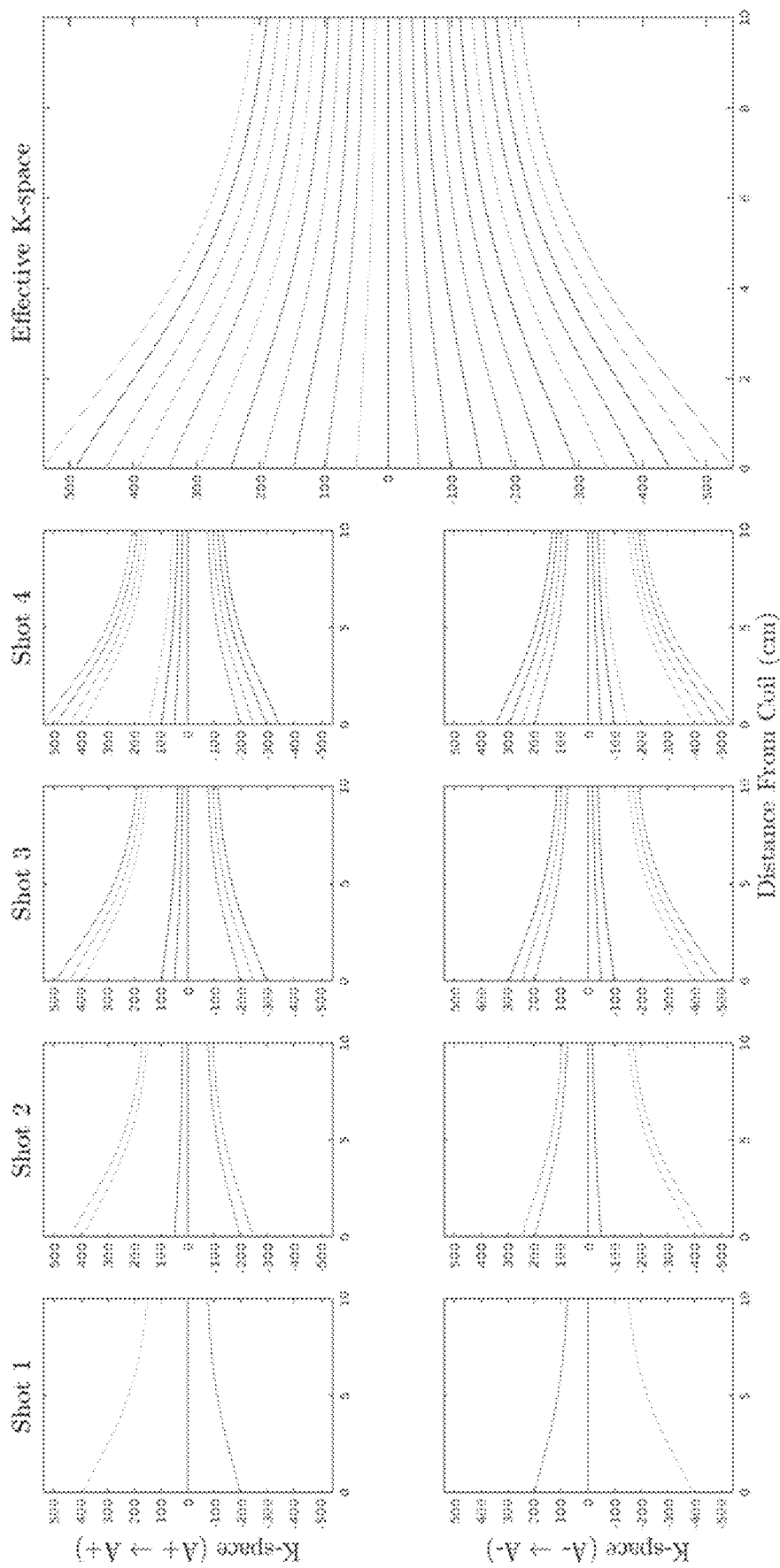
FIG. 2 illustrates an example filling order of k-space. To capture both sides of k-space, the initial pair of AFPs have different frequency sweeps (A+ to A+) and (A− to A−). By changing the direction of the frequency sweeps, the initial step in k-space corresponds to either a negative or positive step, respectively. Combining all the shots, the effective filling of k-space is uniform. Four shots were performed with 3 echoes acquired per shot. A realistic 10-cm surface coil was used to create the spatially varying $B_1^+$ field.

Using Eqn. (6) to model a 1D ME-FREE sequence that includes four shots, in which three echoes are acquired in each shot, the previously described filling order is illustrated in FIG. 2. The pulses chosen for the simulation shown in FIG. 2 were HS4 RF pulses with a bandwidth of 2 kHz, $R_{min}$ of 30, $R_{max}$ of 52.5, and $\Delta R$ of 7.5.

Figure 3:
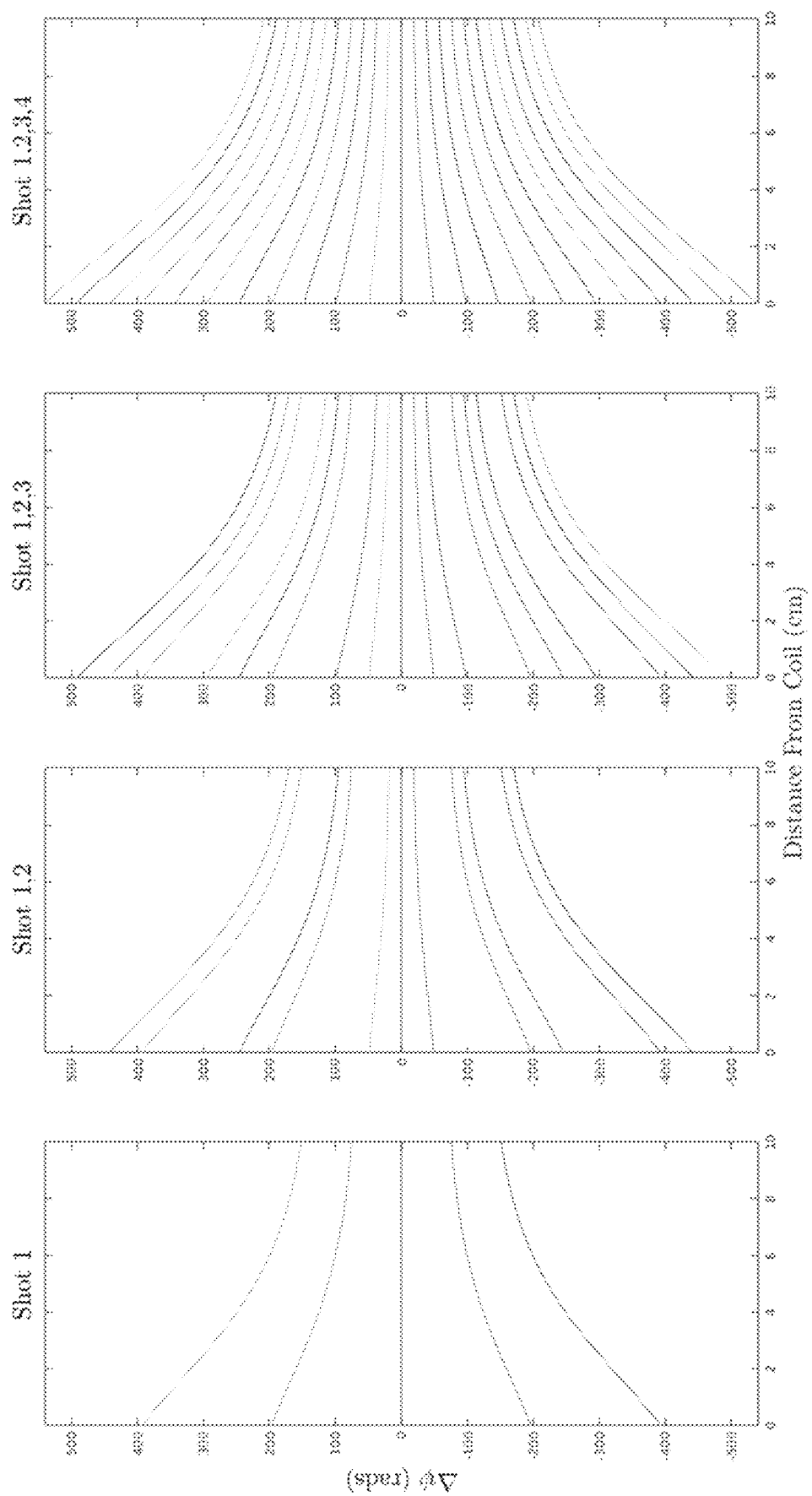
FIG. 3 illustrates an example filling of k-space after sorting. The initial pair of AFPs has matching R-values and perfectly refocus any phase in the first echo, corresponding to k=0. The remaining echoes are separated by a fixed value corresponding to Echo·ψ(r) of the $R_{min}$th pulse. As the difference in R between the initial pair of pulses, the first echo begins to step away from k=0, but the spacing between the remaining 2 echoes are still constant. Both half of k-space were combined, and four shots were performed with 3 echoes acquired per shot. A realistic 10-cm surface coil was used to create the spatially varying $B_1^+$ field.

The results show the effective filling order of k-space as the number of shots increases with three echoes acquired (FIG. 2). A byproduct of utilizing a train of AFPs is that the direction of the jump in k-space will alternate between positive and negative values, depending on the initial step direction of the pair of pulses. Thus, when reconstructs an image, the corresponding echoes are sorted into their appropriate location. When both halves of k-space are combined, the filling order becomes more apparent; showing the fixed spacing of the echoes and the role the initial pair of pulses has on modulating the initial phase, as illustrated in FIG. 3.

These simulations show that the ME-FREE sequence can uniformly cover k-space and also illustrate possible methods to further accelerate image acquisitions. By employing multiple receive coils, k-space could be readily undersampled and reconstructed using conventional pTx techniques.

Figure 4:
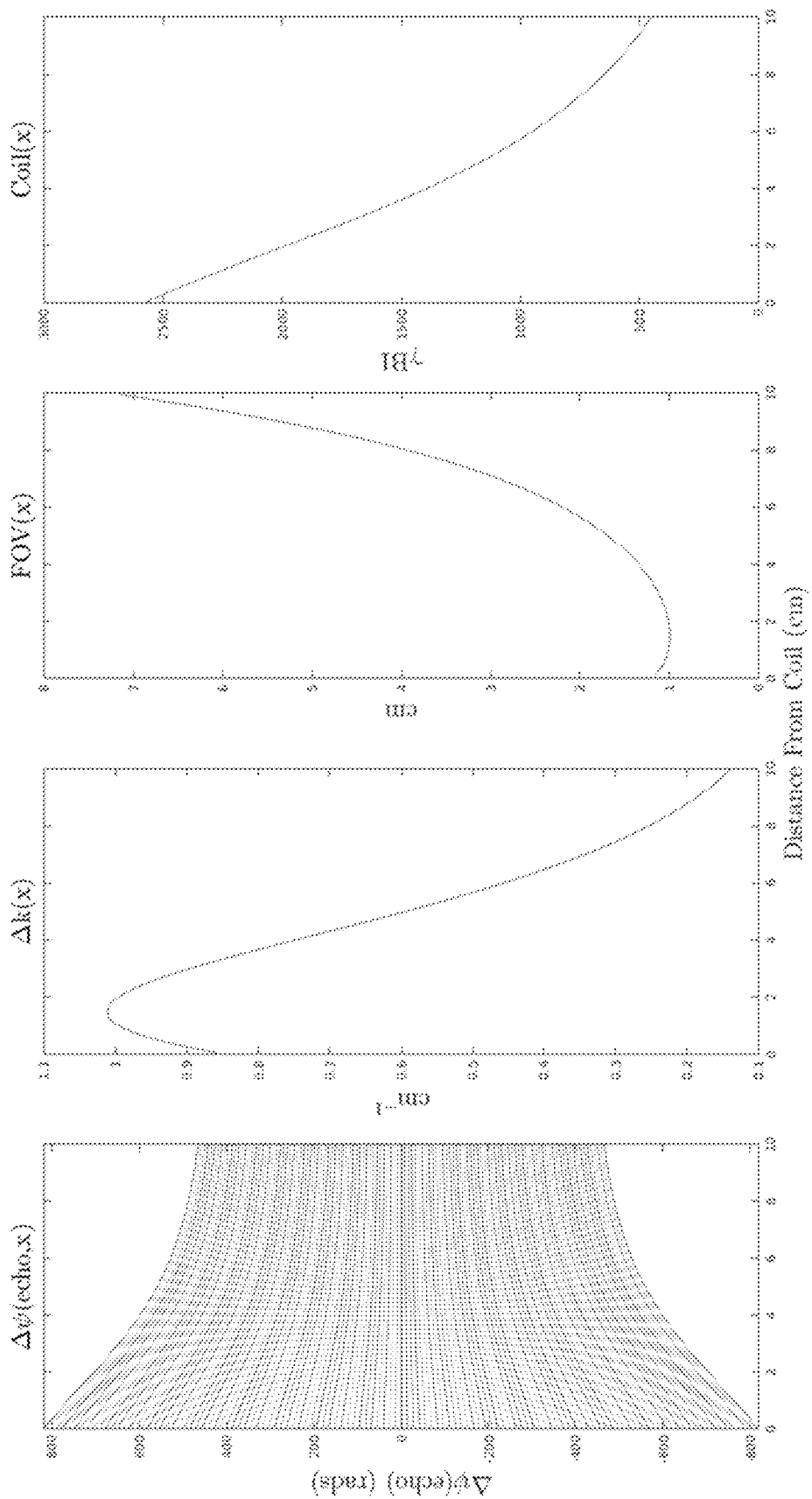
FIG. 4 illustrates imaging parameters used in an example simulation of the ME-FREE sequence utilizing HS4 RF pulses. The first panel shows the k-space coverage after the sorting of the echoes. The second and third panels correspond to the spatially varying Δk and FOV of the imaging experiment. The last panel shows the $B_1^+$ transmit profile along the center axis of the coil. There is some inherent nonlinear encoding in the example implementation of the ME-FREE method, but it is heavily dominated by the nonlinear spatial variation of the surface coil used in the simulation. The pulse parameters: 10 Shots, 6 echoes, $R_{min}$ of 35, $R_{max}$ of 66.5, ΔR of 3.5, Bw=4 kHz, and HS4s. The $B_1^+$ transmit profile was generated using a Biot-savart simulation of a single loop, curved 10-cm surface coil such that $\omega_1^{max}(r_{max})$=2.6 kHz and $\omega_1^{max}(r_{min})$=0.45 kHz.

To test the performance of the sequence, a Bloch simulator was developed to study the 2D spin dynamics during an ME-FREE experiment. A grid of $512^2$ isochromats were initially considered with a sub-voxel averaging factor of 4 to give an effective grid of $128^2$ isochromats. It was assumed that a perfect $\pi/2$ excitation was initially applied to place all isochromats onto the transverse plane. To create a spatially varying $B_1^+$ field, a 2D Biot-Savart model was generated for a single-loop, curved 10-cm surface coil with $\omega_1^{max}(r_{max})$= 2.6 kHz and $\omega_1^{max}(r_{min})$=0.45 kHz. Several different simulations were performed utilizing HS4 pulses, but with varied parameters to adjust the adiabaticity of the pulses in the sequence. All reconstructions were performed using a fast Fourier Transform. To determine the imaging parameters of the sequence, a simulation using Eqn. (6) and its derivative was performed, as illustrated in FIG. 4.

Figure 5:
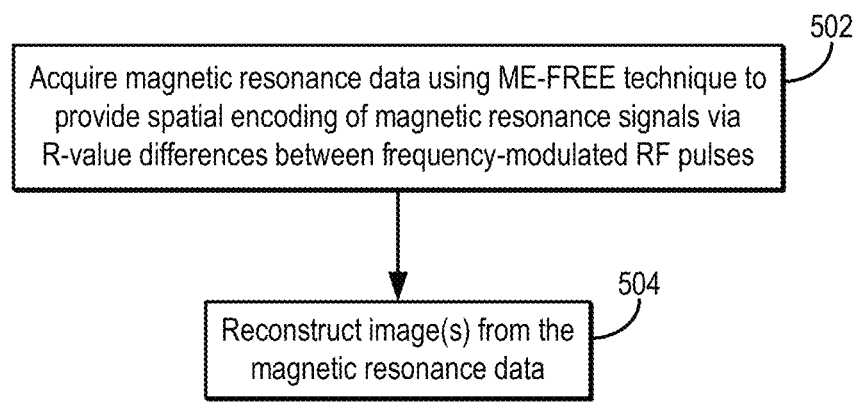
FIG. 5 is a flowchart of an example method of an example method for magnetic resonance imaging using a multi-echo frequency-modulated Rabi encoded echoes ("ME-FREE") technique as described in some embodiments of the present disclosure.

Referring now to FIG. 5, a flowchart is illustrated as setting forth the steps of an example method for magnetic resonance imaging a subject using an ME-FREE technique to acquire data from the subject. As described above in more detail, in an ME-FREE technique data are acquired using gradients in the B1 RF field to provide spatial encoding (e.g., phase encoding) of magnetic resonance signals over a train of RF pulses that result in multiple echoes being generated and sampled in each shot.

The method includes acquiring magnetic resonance data from a subject using an ME-FREE technique, as indicated at step 502. As described above, the magnetic resonance data can be generally acquired using an ME-FREE technique, in which spatial encoding of magnetic resonance signals is provided, at least partially, by appropriately modulating the B1 RF field in a series of RF pulses used in an echo train, as opposed to establishing magnetic field gradients (e.g., gradients in the main magnetic field) by use of magnetic field gradient coils.

In general, the magnetic resonance data can be acquired using a pulse sequence that includes a train of frequency-modulated RF pulses to generate multiple echoes in each repetition and/or shot of the pulse sequence. By varying the time-bandwidth products of the frequency-modulated RF pulses in different repetitions of the pulse sequence (and/or different shots of a multi-shot pulse sequence), different phases are imparted to the magnetic resonance signals, thereby providing different spatial encoding of the magnetic resonance signals. For example, differences in the time-bandwidth products of two frequency-modulated RF pulses in one repetition and/or shot of a pulse sequence will impart one phase value, so by adjusting that difference between time-bandwidth products different phase values can be imparted in subsequent repetitions and/or shots.

For instance, magnetic resonance data can be acquired using a pulse sequence that generally includes an RF excitation pulse and a train of frequency-modulated RF pulses that result in the formation of multiple echoes in each repetition and/or shot of the pulse sequence. As a non-limiting example, a first frequency-modulated RF pulse can have a first time-bandwidth product and a second frequency-modulated RF pulse can have a second time-bandwidth product that is different from the first time-bandwidth product. The remainder of the RF pulses in the pulse train can have the first time-bandwidth product, but with each subsequent RF pulse having an alternating polarity. An example of such a pulse sequence is shown in FIG. 1. The frequency-modulated RF pulses can include various different types of frequency-modulated RF pulses, such as adiabatic full-passage RF pulses, HSn RF pulses, chirp RF pulses, and so on.

A difference between the first time-bandwidth product and the second time-bandwidth product is selected or otherwise designed such that a phase is imparted to magnetic resonance signals formed in response to the RF excitation pulse. By changing this difference between the first time-bandwidth product and the second time-bandwidth product, different phase values are imparted to the magnetic resonance signals, thereby providing a mechanism for spatially encoding the magnetic resonance signals. Further, alternating RF pulses are used to augment the phase of later echoes in an approximately linear fashion. As noted above, these later RF pulses can have the same, first time-bandwidth product. In some embodiments, the difference between the first and second time-bandwidth products can be changed by adjusting a duration of one or more of the frequency-modulated RF pulses. For example, the pulse duration of one or more of the frequency-modulated RF pulses can be increased in subsequent repetition time ("TR") periods of the pulse sequence. In some instances, the bandwidth of the first frequency-modulated RF pulse and/or the second frequency-modulated RF pulse can be held constant while adjusting the RF pulse duration. In some repetitions of the pulse sequence, the first time-bandwidth product can be set equal to the second time-bandwidth product.

The magnetic resonance data are acquired by sampling the magnetic resonance signals formed in response to the RF excitation pulse and spatially encoded as a result of the time-bandwidth product difference between the frequency-modulated RF pulses.

After the magnetic resonance data are acquired, one or more images are reconstructed from the data, as indicated at step 504. In some embodiments, a Fourier transform-based image reconstruction can be used to reconstruct images from the magnetic resonance data, similar to conventional reconstruction techniques. In other embodiments, other reconstruction techniques can be used, including parallel image reconstruction techniques, iterative reconstruction techniques, machine learning-based imaged reconstruction techniques, and so on.

As one non-limiting example, a model-based image reconstruction technique can be used to reconstruct images acquired using an ME-FREE technique. For instance, an iterative first-order proximal gradient method can be used to solve a regularized linear inverse problem that is based on a model of the ME-FREE encoding technique. As an example, the following regularized linear inverse problem can be solved:

$$\|Ax-y\|_2^2+\lambda\Omega(x) \tag{7}$$

where A represents the encoding matrix, which can be determined via full Bloch simulation with known field inhomogeneities and receive coil sensitivities. For instance, as a non-limiting example, to generate the encoding matrix, the Bloch equations can be simulated using a 2D parallelized Bloch simulator. The simulation can be ran with a sub-voxel averaging factor (e.g., a sub-voxel averaging factor of 8) along both dimensions to mimic a continuous object. With the encoding matrix generated, the receive coil sensitivity profiles can be incorporated into the model by constructing a matrix out of the coil sensitivities as each coil sees the same encoding. This approach can be readily extended to multiple receive coils and used to reconstruct images from undersampled data, or other data acquired using accelerating data acquisition techniques. Advantageously, using a model-based image reconstruction allows for more variation in how ME-FREE encoding can be implemented. For example, when using a model-based image reconstruction B1 coils with nonlinear gradients can be used, since the nonlinear B1 field's distortions can be appropriately corrected for using the model-based image reconstruction.

To minimize any potential artifacts that may be caused by nonideal AFP pulses, the adiabaticity of the pulses used may be increased. As one example, adiabaticity may be increased by increasing the duration of the pulses while fixing the bandwidth, by increasing the peak power to ensure the pulse has sufficient power to be adiabatic across the region-of-interest, or both. Another benefit of the ME-FREE technique leverages the inherent ability of an AFP pulse to invert a wide bandwidth of isochromats in the presence of some constant offset, like a chemical shift or resonance offset. By using a train of AFP pulses in a spin echo—like configuration, spins having off-resonance frequencies contained in the bandwidth of the adiabatic pulse experience an inversion; thus, their different evolution phases are refocused. To further improve the ME-FREE resilience to offsets, the bandwidth of the pulses may be increased to expand the adiabatic region where a good inversion occurs.

Relative to a multi-shot FREE technique, which uses longer RF pulses that behave more adiabatically at lower peak power, the ME-FREE techniques described in the present disclosure can use shorter RF pulses with larger peak power, thereby providing for comparable results at only a fraction of the average power delivered using multi-shot FREE techniques. For example, a multi-shot FREE technique may have an average power delivery of approximately 3.6 W to collect a 64×128 image matrix (=FREE×Readout) with a TR=3 s, whereas the average power delivered by a comparable ME-FREE technique may have an average power delivery of 2.9 W for a 125×128 matrix with TR=2.5 s. This value for the ME-FREE sequence corresponds to a local 10-g SAR of 5.0 W/kg at the hottest spot closest to the coil. Even considering the smallest TR sequence, a safety factor of 2 can thus be maintained as compared with the limits set forth for normal operating conditions of a local transmit coil used on a human head. This safety factor can be further increased by pairing the multi-echo technique with a lower field strength magnet (e.g., <1.5 T).

In addition to the reduction in average power delivered, and thus SAR, the ME-FREE techniques described in the present disclosure are also able to collect an image in significantly less time. As compared with the original FREE implementation, the ME-FREE technique are capable of achieving comparable spatial resolution with an acceleration factor upwards of 3.9. Further acceleration may be achieved by incorporating more advanced imaging techniques, like parallel receive and partial Fourier.

With the benefits of a reduction in total scan time and/or average power delivered, different types of contrast may be possible using the ME-FREE technique. For example, by increasing TR at a fixed TE, the contrast gradually shifts to a more T2-weighted image. As another example, an inversion pulse can be added before the initial excitation to create a FLAIR sequence. In this configuration, a 125×128 FLAIR image may be acquired in 6 minutes, thereby making the sequence clinically viable.

In some examples, the ME-FREE techniques described in the present disclosure can be combined with a nonlinear B1+ field to perform spatial encoding. By having a spatially variable resolution and Δk vary across the ROI, it is possible to selectively sample regions with steep B1+ field at extremely high resolutions without needing to acquire the entire image at such fine resolution. To take advantage of this native high resolution, the reconstruction technique used to correct the acquired ME-FREE images may use a zero padding-type approach before performing distortion and sensitivity correction.

In some implementations, this spatially varying resolution may be exploited using alternative coil geometries to produce more favorable transmit fields. For example, using alternative coil geometries and techniques, a steep approximately linear B1+ amplitude may be created across different regions in the ROI, thereby further minimizing artifacts and enabling selective zoom imaging with very high spatial resolution. Alternatively, parallel transmission-type implementations can allow for the use of shallower B1+ gradients that cover the entire ROI, thereby allowing for a reduction in the SAR. Advantageously, compared to techniques like TRASE, ME-FREE is not constrained by the need for complex hardware and instead can make use of a coil to produce a spatially varying B1+ field of sufficient power for the AFP pulses.

Figure 6:
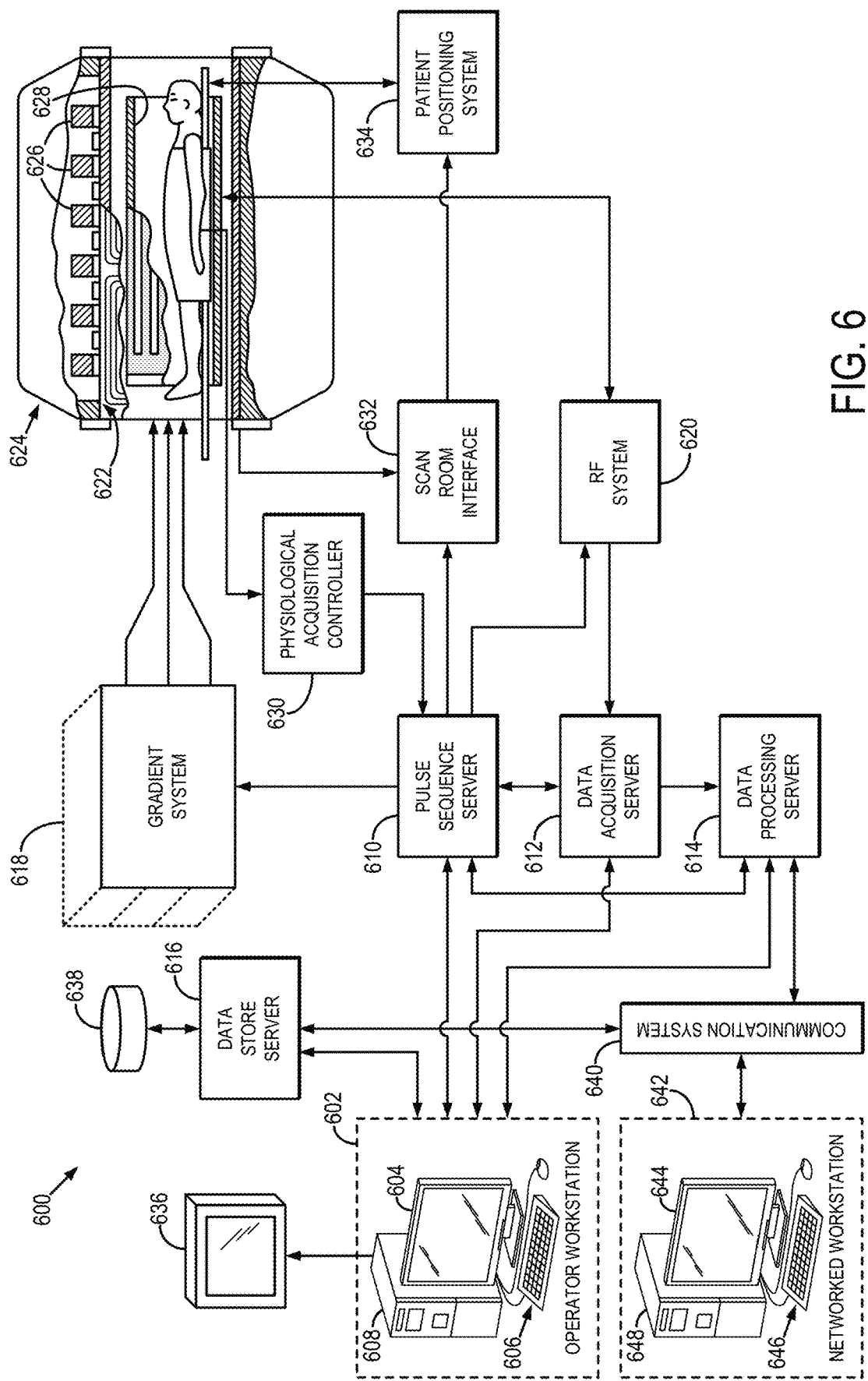
FIG. 6 is a block diagram of an example MRI system that can implement the methods described in the present disclosure.

Referring particularly now to FIG. 6, an example of an Mill system 600 that can implement the methods described here is illustrated. The MM system 600 includes an operator workstation 602 that may include a display 604, one or more input devices 606 (e.g., a keyboard, a mouse), and a processor 608. The processor 608 may include a commercially available programmable machine running a commercially available operating system. The operator workstation 602 provides an operator interface that facilitates entering scan parameters into the Mill system 600. The operator workstation 602 may be coupled to different servers, including, for example, a pulse sequence server 610, a data acquisition server 612, a data processing server 614, and a data store server 616. The operator workstation 602 and the servers 610, 612, 614, and 616 may be connected via a communication system 640, which may include wired or wireless network connections.

The pulse sequence server 610 functions in response to instructions provided by the operator workstation 602 to operate a gradient system 618 and a radiofrequency ("RF") system 620. Gradient waveforms for performing a prescribed scan are produced and applied to the gradient system 618, which then excites gradient coils in an assembly 622 to produce the magnetic field gradients $G_x$, $G_y$, and $G_z$ that are used for spatially encoding magnetic resonance signals. The gradient coil assembly 622 forms part of a magnet assembly 624 that includes a polarizing magnet 626 and a whole-body RF coil 628.

RF waveforms are applied by the RF system 620 to the RF coil 628, or a separate local coil to perform the prescribed magnetic resonance pulse sequence. Responsive magnetic resonance signals detected by the RF coil 628, or a separate local coil, are received by the RF system 620. The responsive magnetic resonance signals may be amplified, demodulated, filtered, and digitized under direction of commands produced by the pulse sequence server 610. The RF system 620 includes an RF transmitter for producing a wide variety of RF pulses used in MRI pulse sequences. The RF transmitter is responsive to the prescribed scan and direction from the pulse sequence server 610 to produce RF pulses of the desired frequency, phase, and pulse amplitude waveform. The generated RF pulses may be applied to the whole-body RF coil 628 or to one or more local coils or coil arrays.

The RF system 620 also includes one or more RF receiver channels. An RF receiver channel includes an RF preamplifier that amplifies the magnetic resonance signal received by the coil 628 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M=\sqrt{I^2+Q^2};$$

and the phase of the received magnetic resonance signal may also be determined according to the following relationship:

$$\varphi = \tan^{-1}\left(\frac{Q}{I}\right).$$

The pulse sequence server 610 may receive patient data from a physiological acquisition controller 630. By way of example, the physiological acquisition controller 630 may receive signals from a number of different sensors connected to the patient, including electrocardiograph ("ECG") signals from electrodes, or respiratory signals from a respiratory bellows or other respiratory monitoring devices. These signals may be used by the pulse sequence server 610 to synchronize, or "gate," the performance of the scan with the subject's heart beat or respiration.

The pulse sequence server 610 may also connect to a scan room interface circuit 632 that receives signals from various sensors associated with the condition of the patient and the magnet system. Through the scan room interface circuit 632, a patient positioning system 634 can receive commands to move the patient to desired positions during the scan.

The digitized magnetic resonance signal samples produced by the RF system 620 are received by the data acquisition server 612. The data acquisition server 612 operates in response to instructions downloaded from the operator workstation 602 to receive the real-time magnetic resonance data and provide buffer storage, so that data is not lost by data overrun. In some scans, the data acquisition server 612 passes the acquired magnetic resonance data to the data processor server 614. In scans that require information derived from acquired magnetic resonance data to control the further performance of the scan, the data acquisition server 612 may be programmed to produce such information and convey it to the pulse sequence server 610. For example, during pre-scans, magnetic resonance data may be acquired and used to calibrate the pulse sequence performed by the pulse sequence server 610. As another example, navigator signals may be acquired and used to adjust the operating parameters of the RF system 620 or the gradient system 618, or to control the view order in which k-space is sampled. In still another example, the data acquisition server 612 may also process magnetic resonance signals used to detect the arrival of a contrast agent in a magnetic resonance angiography ("MRA") scan. For example, the data acquisition server 612 may acquire magnetic resonance data and processes it in real-time to produce information that is used to control the scan.

The data processing server 614 receives magnetic resonance data from the data acquisition server 612 and processes the magnetic resonance data in accordance with instructions provided by the operator workstation 602. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 614 are conveyed back to the operator workstation 602 for storage. Real-time images may be stored in a data base memory cache, from which they may be output to operator display 602 or a display 636. Batch mode images or selected real time images may be stored in a host database on disc storage 638. When such images have been reconstructed and transferred to storage, the data processing server 614 may notify the data store server 616 on the operator workstation 602. The operator workstation 602 may be used by an operator to archive the images, produce films, or send the images via a network to other facilities.

The Mill system 600 may also include one or more networked workstations 642. For example, a networked workstation 642 may include a display 644, one or more input devices 646 (e.g., a keyboard, a mouse), and a processor 648. The networked workstation 642 may be located within the same facility as the operator workstation 602, or in a different facility, such as a different healthcare institution or clinic.

The networked workstation 642 may gain remote access to the data processing server 614 or data store server 616 via the communication system 640. Accordingly, multiple networked workstations 642 may have access to the data processing server 614 and the data store server 616. In this manner, magnetic resonance data, reconstructed images, or other data may be exchanged between the data processing server 614 or the data store server 616 and the networked workstations 642, such that the data or images may be remotely processed by a networked workstation 642.

The present disclosure has described one or more preferred embodiments, and it should be appreciated that many equivalents, alternatives, variations, and modifications, aside from those expressly stated, are possible and within the scope of the invention.

The invention claimed is:

1. A method for magnetic resonance imaging, the method comprising:
   (a) acquiring magnetic resonance data from a subject using a magnetic resonance imaging (MRI) system by:
      generating a pulse sequence with the MRI system, the pulse sequence comprising:
         a radio frequency (RF) excitation pulse;
         a train of frequency-modulated RF pulses comprising at least:
            a first frequency-modulated RF pulse having a first time-bandwidth product, wherein the first frequency-modulated RF pulse is generated after the RF excitation pulse;
            a second frequency-modulated RF pulse having a second time-bandwidth product, wherein the second frequency-modulated RF pulse is generated after the first frequency-modulated RF pulse;

a plurality of frequency-modulated RF pulses generated after the second frequency-modulated RF pulse and each having a third time-bandwidth product;

acquiring magnetic resonance data with the MRI system by sampling magnetic resonance signals formed in multiple echoes in response to the RF excitation pulse, wherein a phase whose value is dependent on the first time-bandwidth product and the second time-bandwidth product and the plurality of frequency-modulated RF pulses is imparted to magnetic resonance signals formed in response to the RF excitation pulse, and a difference between the first time-bandwidth product and the second time-bandwidth product is changed at least one of within the pulse sequence or in repetitions of the pulse sequence in order to phase encode the magnetic resonance data;

(b) reconstructing an image from the acquired magnetic resonance data.

2. A method for magnetic resonance imaging, the method comprising:

(a) acquiring magnetic resonance data from a subject using a magnetic resonance imaging (MM) system to generate a pulse sequence that phase encodes the magnetic resonance data by imparting a phase to magnetic resonance signals by applying a series of frequency-modulated radio frequency (RF) pulses to the subject to form multiple echoes in each repetition of the pulse sequence, wherein at least one of the plurality of frequency-modulated RF pulses has a variable time-bandwidth product relative to other ones of the plurality of frequency-modulated RF pulses, thereby defining an R-difference value between at least two of the frequency-modulated RF pulses, which causes the phase to be imparted to the magnetic resonance signals; and (b) reconstructing an image from the acquired magnetic resonance data.

3. The method of claim 1, wherein each subsequent one of the plurality of frequency-modulated RF pulses has an alternating polarity.

4. The method of claim 1, wherein each subsequent one of the plurality of frequency-modulated RF pulses has an equal polarity.

5. The method of claim 1, wherein the difference between the first time-bandwidth product and the second time-bandwidth product determines an initial phase step for phase encoding the magnetic resonance data and the plurality of frequency-modulated RF pulses impart a constant phase for phase encoding subsequent ones of the multiple echoes.

6. The method of claim 1, wherein the third time-bandwidth product is same as the first time-bandwidth product.

7. The method of claim 1, wherein the first frequency-modulated RF pulse and the second frequency-modulated RF pulse are adiabatic full-passage RF pulses.

8. The method of claim 1, wherein the first frequency-modulated RF pulse and the second frequency-modulated RF pulse are hyperbolic secant (HS) RF pulses.

9. The method of claim 1, wherein the difference between the first time-bandwidth product and the second time-bandwidth product is changed by changing a pulse duration of at least one of the first frequency-modulated RF pulse or the second frequency-modulated RF pulse in the repetitions of the pulse sequence.

10. The method of claim 1, wherein the first time-bandwidth product is different from the second time-bandwidth product.

11. The method of claim 1, wherein in at least one repetition of the pulse sequence the first time-bandwidth product is set to be equal to the second time-bandwidth product.

12. The method of claim 2, wherein the pulse sequence phase encodes the magnetic resonance data by changing the R-difference value while acquiring the magnetic resonance data, such that a different phase is imparted to the magnetic resonance signals with each different R-difference value.

13. The method of claim 2, wherein the pulse sequence is a multi-shot pulse sequence and the R-difference value is changed for each shot of the multi-shot pulse sequence.

14. The method of claim 2, wherein the frequency-modulated RF pulses comprise adiabatic full passage RF pulses.

15. The method of claim 2, wherein the frequency-modulated RF pulses comprise chirp RF pulses.

16. The method of claim 2, wherein the R-difference value is set to zero in at least one repetition of the pulse sequence.

17. The method according to any one of claim 2, wherein reconstructing the image from the acquired magnetic resonance data comprises using an iterative model-based image reconstruction that models spatial encoding based on a signal evolution simulation.

18. The method of claim 9, wherein changing the pulse duration of at least one of the first frequency-modulated RF pulse or the second frequency-modulated RF pulse in the repetitions of the pulse sequence comprises increasing the pulse duration.

19. The method of claim 9, wherein a bandwidth of the first frequency-modulated RF pulse and the second frequency-modulated RF pulse is held constant while changing the pulse duration of at least one of the first frequency-modulated RF pulse or the second frequency-modulated RF pulse in the repetitions of the pulse sequence.

20. The method of claim 12, wherein the R-difference value is changed by increasing a pulse duration of one of the frequency-modulated RF pulses while keeping a bandwidth of the frequency-modulated RF pulses constant.

21. The method of claim 14, wherein the adiabatic full passage RF pulses comprise hyperbolic secant RF pulses.

22. The method of claim 17, wherein the signal evolution simulation comprises a full Bloch simulation.

23. The method of claim 17, wherein the iterative model-based image reconstruction takes receiver coil sensitivity data as an additional input.

24. The method of claim 17, wherein the iterative model-based image reconstruction comprises iteratively solving a regularized linear inverse problem.

25. The method of claim 20, wherein the R-difference value is increased by increasing the pulse duration of one of the frequency-modulated RF pulses while keeping the bandwidth of the frequency-modulated RF pulses constant.

* * * * *